US011500150B2

(12) United States Patent
Choe et al.

(10) Patent No.: US 11,500,150 B2
(45) Date of Patent: Nov. 15, 2022

(54) WAVEGUIDE PHOTODETECTOR (71) Applicant: Electronics and Telecommunications Research Institute, Daejeon (KR)

(72) Inventors: Joong-Seon Choe, Daejeon (KR); Duk Jun Kim, Daejeon (KR); Jong-Hoi Kim, Daejeon (KR); Jonghyurk Park, Daejeon (KR); Won Seok Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/173,681

(22) Filed: Feb. 11, 2021

(65) Prior Publication Data
US 2021/0255385 A1 Aug. 19, 2021

(30) Foreign Application Priority Data

Feb. 13, 2020 (KR) ........................ 10-2020-0017858

(51) Int. Cl.
G02B 6/12 (2006.01)
G02B 6/42 (2006.01)
G02B 6/122 (2006.01)

(52) U.S. Cl.
CPC ..... *G02B 6/12004* (2013.01); *G02B 6/12021* (2013.01); *G02B 6/12028* (2013.01);
(Continued)

(58) Field of Classification Search
CPC ........ G02B 6/122; G02B 6/1228; G02B 6/42; G02B 6/4201; G02B 6/12004;
(Continued)

(56) References Cited

U.S. PATENT DOCUMENTS 5,054,871 A 10/1991 Deri et al.
5,315,128 A 5/1994 Hunt et al.
(Continued)

FOREIGN PATENT DOCUMENTS

CN 105137537 A * 12/2015 ......... G02B 6/12009

OTHER PUBLICATIONS

Frank J. Effenberger et al., "Ultrafast, Dual-Depletion Region, InGaAs/InP p-i-n Detector", Journal of Lightwave Technology, Aug. 1996, pp. 1859-1864, vol. 14, No. 8.
(Continued)

*Primary Examiner* — Daniel Petkovsek
(74) *Attorney, Agent, or Firm* — Kile Park Reed & Houtteman PLLC (57) ABSTRACT

Provided is a waveguide photodetector including a semiconductor substrate, a first optical waveguide and a second optical waveguide, which are sequentially laminated on the semiconductor substrate, in which each of the first optical waveguide and the second optical waveguide includes a first portion and a second portion, and the first portion extends from the second portion in a first direction parallel to a top surface of the semiconductor substrate, a refractive index matching layer disposed on the second portion of the second optical waveguide, a clad layer disposed on the refractive index matching layer, and an absorber disposed between the refractive index matching layer and the clad layer. Here, the second optical waveguide has a first conductive-type, the clad layer has a second conductive-type opposite to the first conductive-type, and the refractive index matching layer includes a first semiconductor layer that is an intrinsic semiconductor layer.

11 Claims, 6 Drawing Sheets

(52) U.S. Cl.
CPC ......... *G02B 6/1228* (2013.01); *G02B 6/4201* (2013.01); *G02B 6/122* (2013.01); *G02B 6/42* (2013.01); *G02B 2006/12126* (2013.01)

(58) Field of Classification Search
CPC ............ G02B 6/12021; G02B 6/12028; G02B 2006/12126
See application file for complete search history.

(56) References Cited

U.S. PATENT DOCUMENTS

| | | |
|---|---|---|
| 6,255,708 B1 | 7/2001 | Sudharsanan et al. |
| 6,330,378 B1 * | 12/2001 | Forrest .................. H01S 5/0262 372/50.21 |
| 7,206,487 B2 * | 4/2007 | Park ....................... G02B 6/305 385/129 |
| 9,360,621 B1 | 6/2016 | Park et al. |
| 10,331,007 B2 * | 6/2019 | Yoneda ................. G02F 1/0353 |
| 2004/0096175 A1 * | 5/2004 | Tolstikhin ............. H01L 31/105 385/14 |
| 2019/0219760 A1 | 7/2019 | Kim et al. |

OTHER PUBLICATIONS

Tuo Shi et al., "Back-to-Back UTC-PDs With High Responsivity, High Saturation Current and Wide Bandwidth", IEEE Photonics Technology Letters, Jan. 15, 2013, pp. 136-139, vol. 25, No. 2.

J. S. Choe et al., "Optimization of waveguide photodetector with thin absorbing layer and large responsivity", Proceedings of SPIE, Jan. 31, 2020, pp. 1-6, vol. 11309, SPIEDigitalLibrary.org/conference-proceedings-of-spie.

\* cited by examiner

WAVEGUIDE PHOTODETECTOR

CROSS-REFERENCE TO RELATED APPLICATIONS

This U.S. non-provisional patent application claims priority under 35 U.S.C. § 119 of Korean Patent Application No. 10-2020-0017858, filed on Feb. 13, 2020, the entire contents of which are hereby incorporated by reference.

BACKGROUND

The present disclosure herein relates to a waveguide photodetector.

A photodetector is an essential component in an optical communication and serves to convert an optical signal into an electrical signal. As a data transmission speed in the optical communication increases, the photodetector is required to increase in operation speed and have a light absorption efficiency more than a certain level.

The photodetector is mainly manufactured by using a semiconductor and made of a semiconductor material depending on a purpose thereof. When the photodetector is manufactured by using the semiconductor, a light absorber absorbs light to generate an electron and a hole. As each of the generated electron and hole moves to an electrode, an electrical signal may be detected.

The photodetector may be classified into a surface incident photodetector and a waveguide photodetector according to a shape thereof. The waveguide photodetector is mainly used at a speed of about 30 GHz or more.

The waveguide photodetector may have a capacitance and a movement time of the electron, which are varied according to a thickness of the absorber.

SUMMARY

The present disclosure provides a waveguide photodetector capable of operating at a high speed and having a high light absorption rate.

An embodiment of the inventive concept provides a waveguide photodetector including: a semiconductor substrate; a first optical waveguide and a second optical waveguide, which are sequentially laminated on the semiconductor substrate, wherein each of the first optical waveguide and the second optical waveguide includes a first portion and a second portion, and the first portion extends from the second portion in a first direction parallel to a top surface of the semiconductor substrate; a refractive index matching layer disposed on the second portion of the second optical waveguide; a clad layer disposed on the refractive index matching layer; and an absorber disposed between the refractive index matching layer and the clad layer. Here, the second optical waveguide has a first conductive-type, and the clad layer has a second conductive-type opposite to the first conductive-type, and the refractive index matching layer includes a first semiconductor layer that is an intrinsic semiconductor layer.

In an embodiment, the absorber may be an intrinsic semiconductor layer, and the absorber may have a thickness in a range from about 0.12 μm to about 0.2 μm.

In an embodiment, the first portion of the second optical waveguide may be tapered in terms of a plane.

In an embodiment, the refractive index matching layer may contact the absorber and the second optical waveguide.

In an embodiment, the refractive index matching layer may have a refractive index less than that of the absorber and greater than that of the second optical waveguide.

In an embodiment, the waveguide photodetector may further include a first conductive-type third optical waveguide disposed between the refractive index matching layer and the second optical waveguide. Here, the third optical waveguide may include a first portion and a second portion, and the first portion of the third optical waveguide protrudes from the second portion of the third optical waveguide and extends in the first direction parallel to the top surface of the semiconductor substrate, the third optical waveguide may include an intrinsic semiconductor layer or a first conductive-type semiconductor layer, and the first portion of the third optical waveguide may include tapered in terms of a plane.

In an embodiment, the second optical waveguide may have a thickness less than that of the first optical waveguide, and the third optical waveguide may have a thickness less than that of the second optical waveguide.

In an embodiment, the absorber may be a semiconductor layer doped with a second conductive-type impurity, and the absorber may have a thickness in a range from about 0.12 μm to about 0.2 μm.

In an embodiment, the refractive index matching layer may further include a second semiconductor layer doped with a first conductive-type impurity, and the second semiconductor layer may be disposed between the first semiconductor layer and the second optical waveguide.

In an embodiment, the refractive index matching layer and the absorber may include semiconductor materials different from each other.

In an embodiment, the refractive index matching layer may include indium-gallium-arsenic-phosphide (InGaAsP), and the absorber may include indium-gallium-arsenide (InGaAs).

In an embodiment, the waveguide photodetector may further include: a first electrode disposed on the second portion of the second optical waveguide and spaced apart from the refractive index matching layer; and a second electrode disposed on the clad layer.

In an embodiment of the inventive concept, a waveguide photodetector includes: a semiconductor substrate including a first region and a second region; an optical waveguide including a first portion on the first region and a second portion on the second region; a refractive index matching layer disposed on the second portion of the optical waveguide; and an absorber disposed on the refractive index matching layer to contact the refractive index matching layer. Here, the first portion of the optical waveguide has a line shape having a width that gradually increases in a direction from the first region to the second region, the refractive index matching layer includes an intrinsic semiconductor layer, the absorber includes an intrinsic semiconductor layer or a p-type semiconductor layer, and the absorber has a thickness in a range from about 0.12 μm to about 0.2 μm.

In an embodiment, the waveguide photodetector may further include a p-type clad layer on the absorber, and the optical waveguide may be an n-type semiconductor layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this invention will be thorough and complete, and will fully convey the scope of the present invention to those skilled in the art. Further, the present invention is only defined by scopes of claims. In addition, the sizes of the elements and the relative sizes between elements may be exaggerated for further understanding of the present invention.

Unless terms used in embodiments of the present invention are differently defined, the terms may be construed as meanings that are commonly known to a person skilled in the art. Hereinafter, the present invention will be described in detail by explaining preferred embodiments of the invention with reference to the attached drawings.

Figure 1:
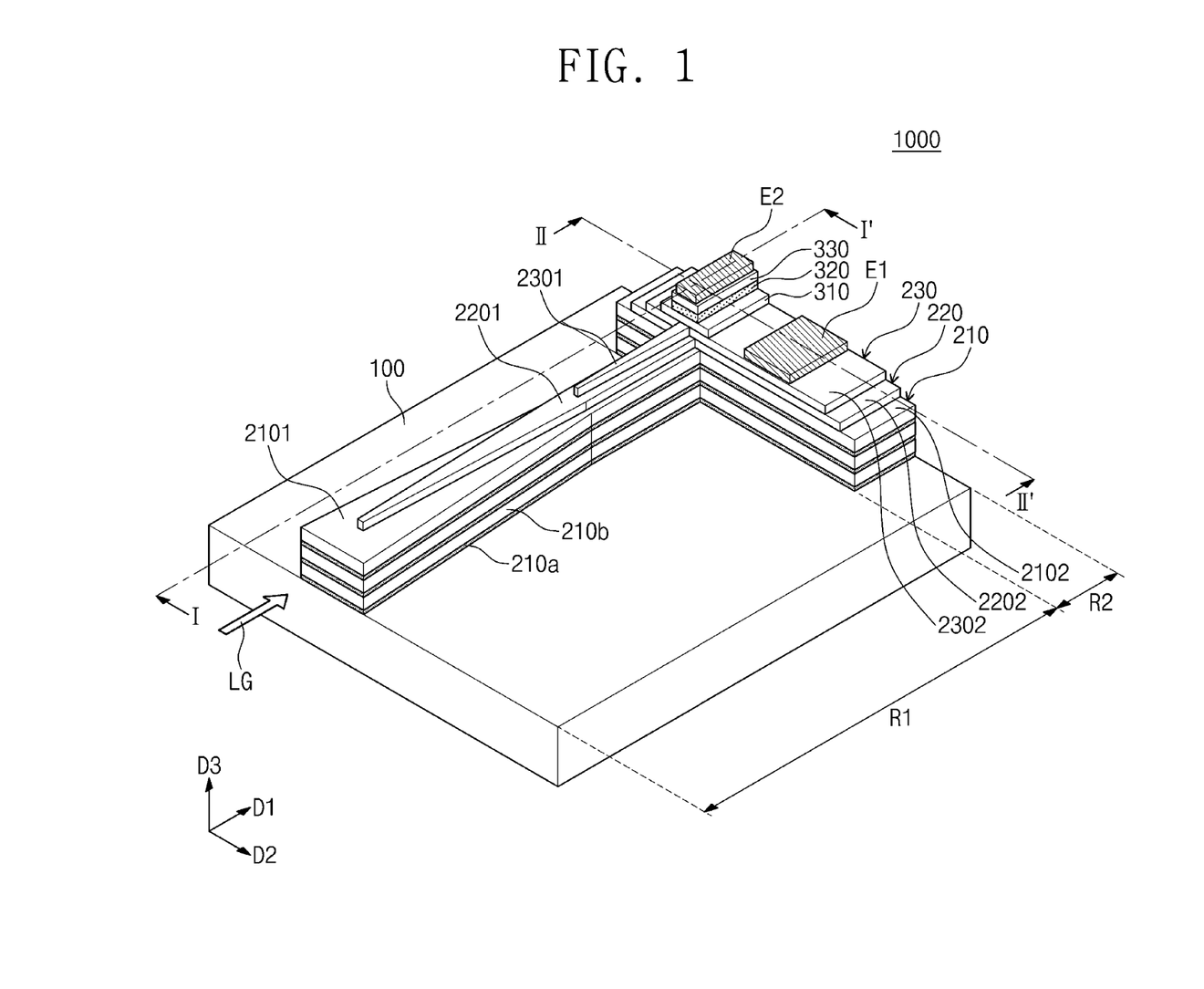
FIG. 1 is a perspective view for explaining a waveguide photodetector according to an embodiment of the inventive concept.
Figure 2:
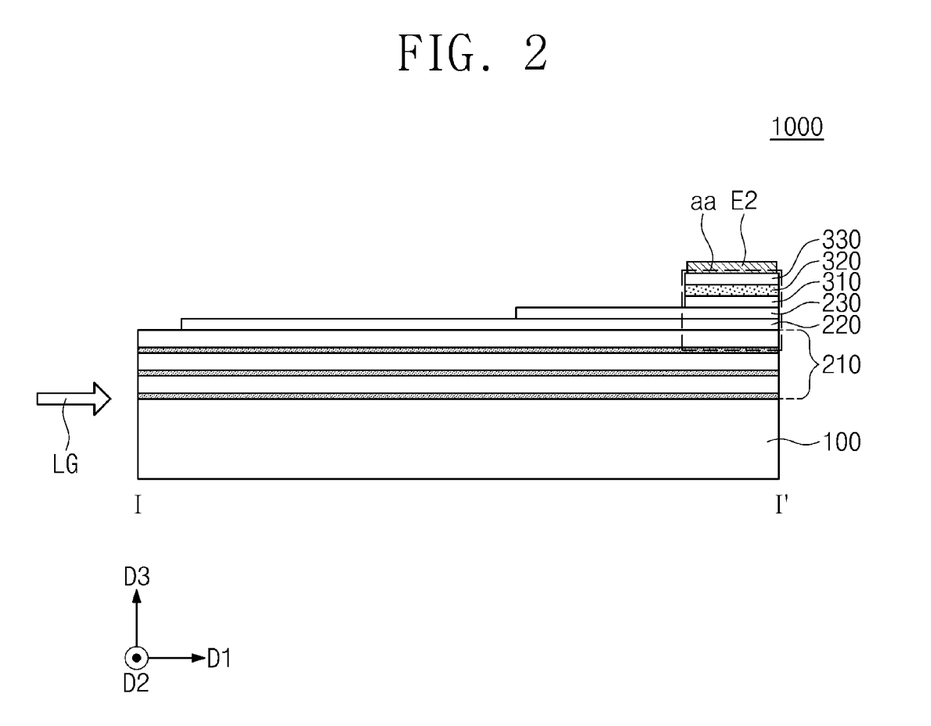
FIG. 2 is a cross-sectional view taken along line I-I' of FIG. 1.
Figure 3:
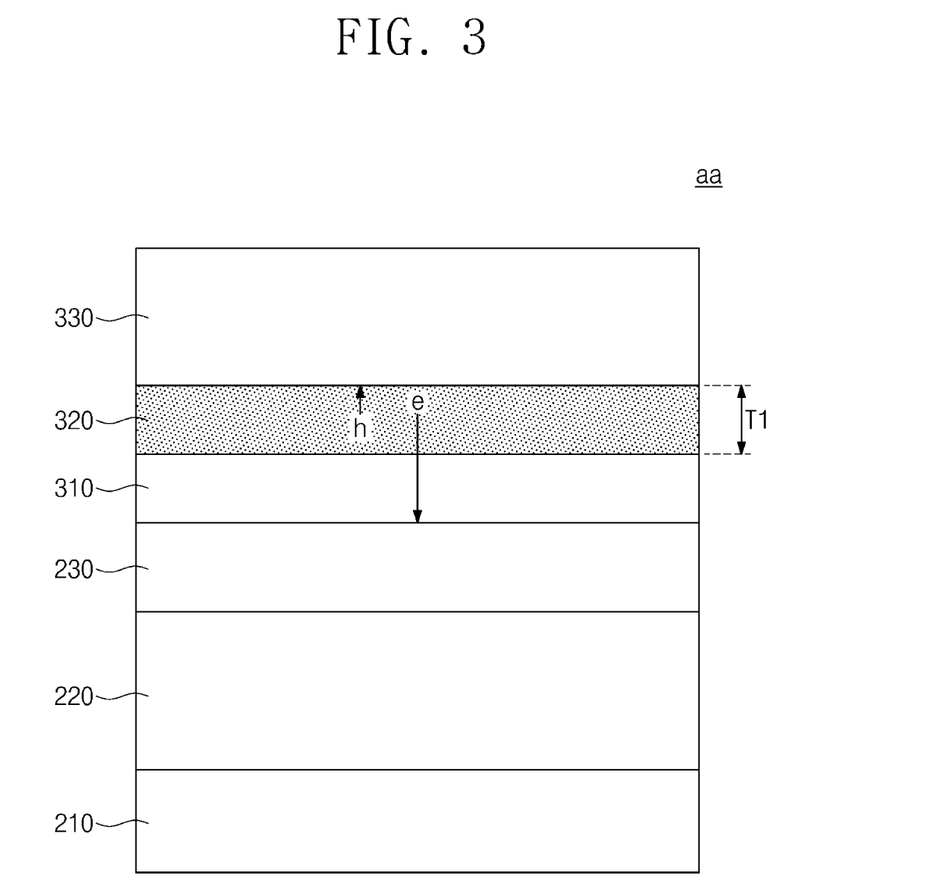
FIG. 3 is an enlarged view illustrating region aa of FIG. 2.
Figure 4:
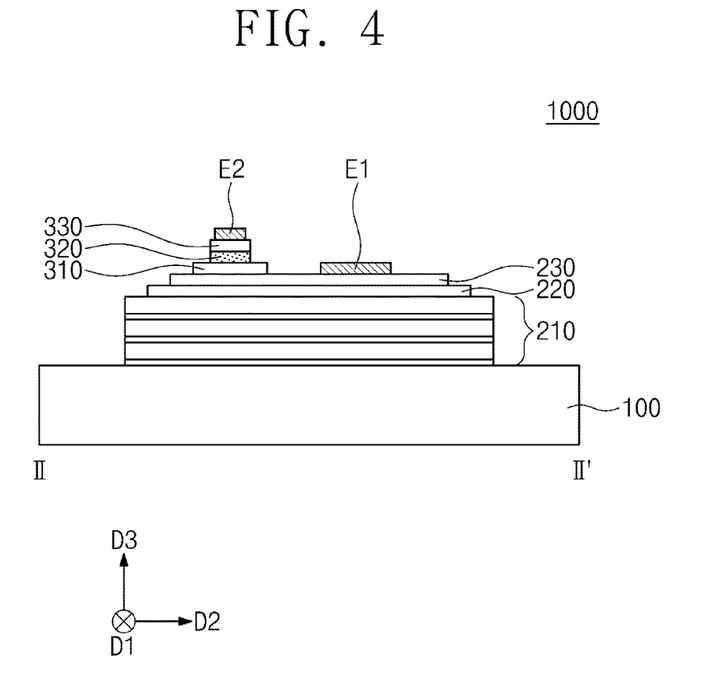
FIG. 4 is a cross-sectional view taken along line II-II' of FIG. 1.

FIG. 1 is a perspective view for explaining a waveguide photodetector according to an embodiment of the inventive concept. FIG. 2 is a cross-sectional view taken along line I-I' of FIG. 1. FIG. 3 is an enlarged view illustrating region aa of FIG. 2. FIG. 4 is a cross-sectional view taken along line II-II' of FIG. 1.

Referring to FIGS. 1 to 4, a waveguide photodetector 1000 according to an embodiment of the inventive concept may include a semiconductor substrate 100, a first optical waveguide 210, a second optical waveguide 220, a third optical waveguide 230, a refractive index matching layer 310, an absorber 320, and a clad layer 330.

The semiconductor substrate 100 may include a first region R1 and a second region R2. The first region R1 may be a region in which a first portion 2101, 2201, and 2301 of each of the first optical waveguide 210, the second optical waveguide 220, and the third optical waveguide 230 is disposed. The second region R2 may be a region in which a second portion 2102, 2202, and 2302 of each of the first optical waveguide 210, the second optical waveguide 220, and the third optical waveguide 230 is disposed. The semiconductor substrate 100 may include indium-phosphide (InP).

The first optical waveguide 210 may be disposed on the semiconductor substrate 100. The first optical waveguide 210 may have a refractive index equal to or greater than that of the semiconductor substrate 100. The first optical waveguide 210 may be a laminated structure in which a first layer 210a made of indium-gallium-arsenic-phosphide (InGaAsP) and a second layer 210b made of indium-phosphide (InP) are alternately laminated. The first layer 210a made of indium-gallium-arsenic-phosphide (InGaAsP) may have a thickness less than that of the second layer 210b made of indium-phosphide (InP). For example, the first layer 210a made of indium-gallium-arsenic-phosphide (InGaAsP) may have a thickness of about 0.1 µm, and the second layer 210b made of indium-phosphide (InP) may have a thickness of about 1 µm.

The first optical waveguide 210 may include the first portion 2101 and the second portion 2102. The first portion 2101 of the first optical waveguide 210 may protrude from the second portion 2102 of the first optical waveguide 210. In terms of a plane, the first portion 2101 of the first optical waveguide 210 may have a line shape extending in a first direction D1 parallel to a top surface of the substrate 100. The second portion 2102 of the first optical waveguide 210 may have a plate shape parallel to the top surface of the substrate 100 and extending in a second direction D2 crossing the first direction D1.

As the first optical waveguide 210 has an energy band gap greater than incident light LG, photoreaction may not be generated. The incident light LG may be transmitted along the first portion 2101 of the first optical waveguide 210.

The second optical waveguide 220 and the third optical waveguide 230 may be disposed on the first optical waveguide 210. Not as illustrated, the third optical waveguide 230 may be omitted.

The second optical waveguide 220 may include indium-gallium-arsenic-phosphide (InGaAsP). The second optical waveguide 220 may be a first conductive-type semiconductor layer or an intrinsic semiconductor layer. When the third optical waveguide 230 is omitted, the second optical waveguide 220 may be the first conductive-type semiconductor layer. The first conductive-type may be an n-type.

The second optical waveguide 220 may have a thickness less than that of the first optical waveguide 210. For example, the second optical waveguide 220 may have a thickness of about 0.35 µm.

The second optical waveguide 220 may have a refractive index equal to or greater than that of the first optical waveguide 210. The second optical waveguide 220 may receive light transmitted through the first optical waveguide 210 and transmit the received light therethrough.

The second optical waveguide 220 may include the first portion 2201 and the second portion 2202. The first portion 2201 of the second optical waveguide 220 may protrude from the second portion 2202 of the second optical waveguide 220. In terms of the plane, the second portion 2202 of the second optical waveguide 220 may have a plate shape extending in the second direction D2, and the first portion 2201 may have a tapered line shape in the first direction D1.

Specifically, the first portion 2201 may have a width that gradually increases in a direction from the first region R1 to the second region R2 in terms of the plane. While light passes through the first portion 2201 of the second optical waveguide 220, a light mode may decrease, and the first portion 2201 of the second optical waveguide 220 may serve as a light mode converter.

Also, as the second optical waveguide 220 has an energy band gap greater than the incident light LG, photoreaction may not be generated.

The third optical waveguide 230 may be disposed on the second optical waveguide 220. For example, the third optical waveguide 230 may include indium-gallium-arsenic-phosphide (InGaAsP). The third optical waveguide 230 may be an n-type semiconductor layer.

The third optical waveguide 230 may have a thickness less than that of the second optical waveguide 220. For example, the third optical waveguide 230 may have a thickness of about 0.2 μm.

The third optical waveguide 230 may have a refractive index equal to or greater than that of the second optical waveguide 220. The third optical waveguide 230 may receive light transmitted through the second optical waveguide 220 and transmit the received light therethrough.

The third optical waveguide 230 may include the first portion 2301 and the second portion 2302. The first portion 2301 may protrude from the second portion 2302. The second portion 2302 may have a plate shape extending in the second direction D2, and the first portion 2301 may have a tapered line shape.

Specifically, the first portion 2301 may have a width that gradually increases in a direction from the first region R1 to the second region R2 in terms of the plane. While light passes through the first portion 2301 of the third optical waveguide 230, a light mode may decrease, and the first portion 2301 of the third optical waveguide 230 may serve as a light mode converter.

Also, as the third optical waveguide 230 has an energy band gap greater than the incident light LG, photoreaction may not be generated.

A first electrode E1 may be disposed on the second portion 2302 of the third optical waveguide 230. Since the first electrode E1 contacts the third optical waveguide 230 that is doped into an n-type and applies a voltage, the first electrode E1 may be referred to as an n-type electrode. The first electrode E1 may include metal, e.g., titanium (Ti), platinum (Pt), germanium (Ge), nickel (Ni), or gold (Au).

The refractive index matching layer 310 spaced apart from the first electrode E1 may be disposed on the second portion 2302 of the third optical waveguide 230. For example, the refractive index matching layer 310 may include indium-gallium-arsenic-phosphide (InGaAsP). The refractive index matching layer 310 may include an intrinsic semiconductor layer.

The refractive index matching layer 310 may have a refractive index having a value between values of a refractive index of the absorber 320 and a refractive index of the third optical waveguide 230. A semiconductor layer having a high impurity concentration may have a relatively low refractive index, and the n-type doped third optical waveguide 230 may have a refractive index less than that of the absorber 320 including an intrinsic semiconductor layer that will be described later. When light is transmitted from the relatively low refractive third optical waveguide 230 to the high refractive absorber 320, the refractive index matching layer 310 may reduce scattering of light caused by sudden variation of the refractive index and smoothly transmit the light to the absorber 320.

Also, as the refractive index matching layer 310 has an energy band gap greater than incident light LG, photoreaction may not be generated.

The absorber 320 may be disposed on the refractive index matching layer 310. The refractive index matching layer 310 may contact the absorber 320. For example, the absorber 320 may include indium-gallium-arsenic-phosphide (InGaAsP). The absorber 320 may be an intrinsic semiconductor layer. The absorber 320 may have a thickness T1 in a range from about 0.12 μm to about 0.2 μm. The absorber 320 may have a band gap having a responsivity by which an electron e and a hole h are produced from the incident light LG. For example, when light having a wavelength of about 1.5 μm or more is transmitted, the electron e and the hole h may be generated in the absorber 320.

The clad layer 330 may be disposed on the absorber 320. The clad layer 330 may be a second conductive-type, which is opposite to the first conductive-type, semiconductor layer. The second conductive-type may be a p-type.

For example, the clad layer 330 may include indium-phosphide (InP). The clad layer 330 may have a thickness greater than that of the absorber 320. For example, the clad layer 330 may have a thickness of about 0.3 μm. As the clad layer 330 has a refractive index less than that of the absorber 320, light may be reflected at a boundary surface between the clad layer 330 and the absorber 320, and the light may be constrained in the absorber 320.

The second electrode E2 may be disposed on the clad layer 330. Since the second electrode E2 contacts the p-type doped clad layer 330 and applies a voltage, the second electrode E2 may be referred to as a p-type electrode. The second electrode E2 may include metal, e.g., titanium (Ti), platinum (Pt), germanium (Ge), nickel (Ni), or gold (Au).

The waveguide photodetector 1000 according to an embodiment of the inventive concept may include the absorber 320 and the refractive index matching layer 310, which are not doped, between the p-type clad layer 330 and the n-type third optical waveguide 230, and the refractive index matching layer 310 may be P-I-N-type photodetector disposed between the absorber 320 and the third optical waveguide 230.

An operation speed of the photodetector according to a signal variation of the incident light may increase as the capacitance decreases, and a charge movement time decreases. As a thickness of the absorber including the intrinsic semiconductor layer increases, the charge movement time may increase while the responsivity may increase, and the capacitance may decrease. Typically, the absorber having a thickness of about 0.4 μm or more is used in consideration of the above balance relationship.

According to an embodiment of the inventive concept, although the absorber has a thickness in a range from about 0.12 μm to about 0.2 μm, the photodetector may have a small capacitance by including the refractive index matching layer 310 that is the intrinsic semiconductor layer. Also, referring to FIG. 3, although the electron e generated from the absorber 320 moves to the third optical waveguide 230 through the refractive index matching layer 310, since the electron e has a movement speed faster than the hole h, and the hole h contacts the p-type clad layer 330 on the thin absorber 320, a mean charge movement time may decrease more than when a thick absorber is used. Thus, the operation speed of the photodetector may increase.

According to an embodiment, the third optical waveguide 230 may be an intrinsic semiconductor layer, and the second optical waveguide 220 may be an n-type semiconductor layer. When the third optical waveguide 230 is the intrinsic semiconductor layer, the operation speed may increase because the capacitance decreases, and the movement speed of the electron is faster than the hole.

Figure 5:
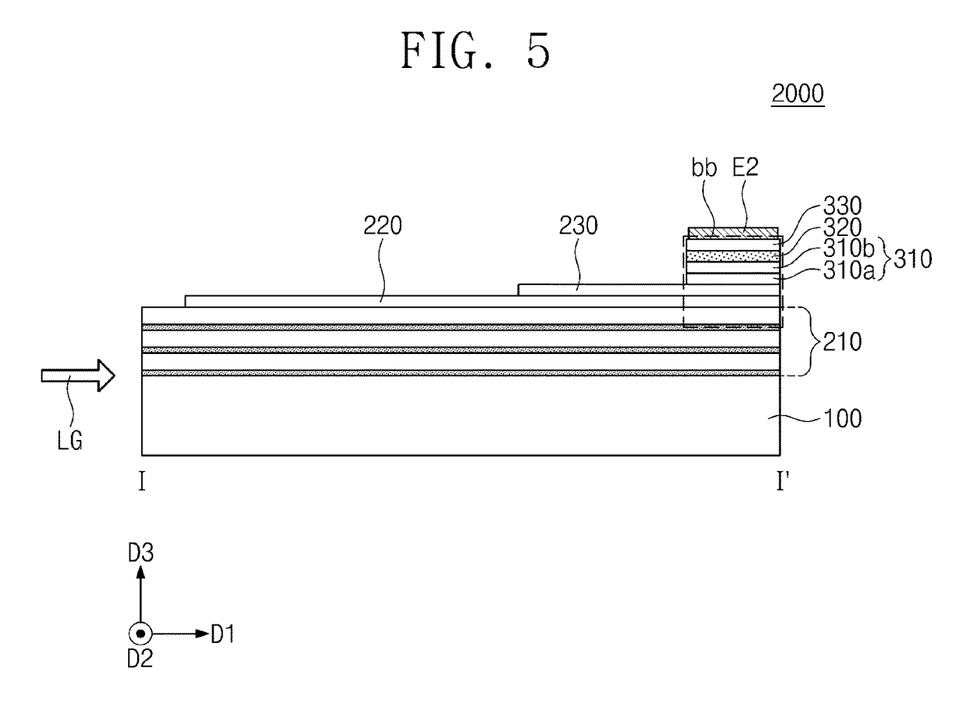
FIG. 5 is a cross-sectional view illustrating a waveguide photodetector according to an embodiment and taken along line I-I' of FIG. 1.
Figure 6:
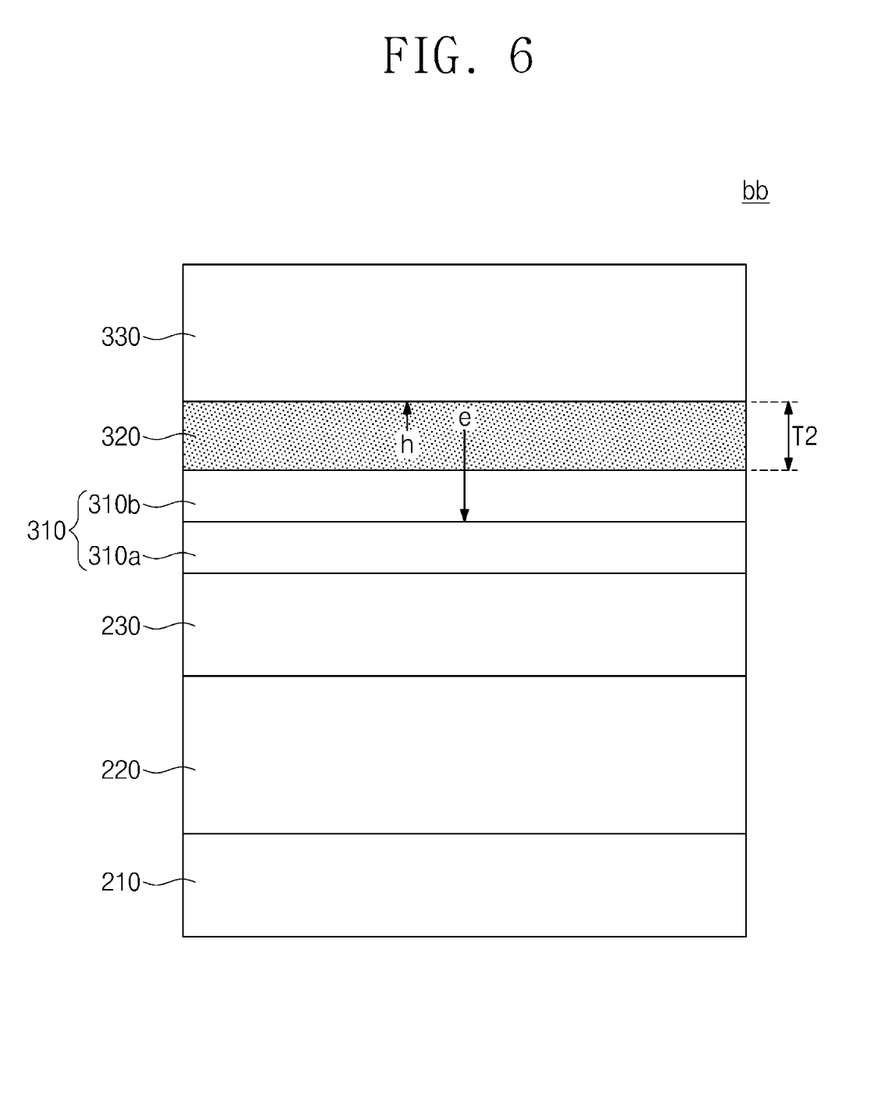
FIG. 6 is an enlarged view illustrating region bb of FIG. 5.
Figure 7:
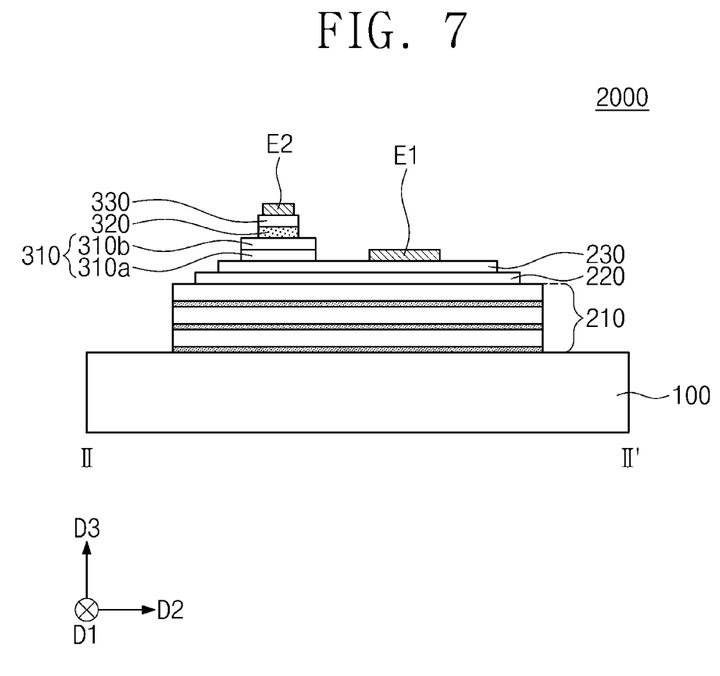
FIG. 7 is a cross-sectional view illustrating a waveguide photodetector according to an embodiment and taken along line II-II' of FIG. 1.

FIG. 5 is a cross-sectional view illustrating a waveguide photodetector 2000 according to an embodiment and taken along line I-I' of FIG. 1. FIG. 6 is an enlarged view illustrating region bb of FIG. 5. FIG. 7 is a cross-sectional view illustrating a waveguide photodetector according to an embodiment and taken along line II-II' of FIG. 1.

Referring to FIGS. 5 to 7, the refractive index matching layer 310 may include a first semiconductor layer 310a and a second semiconductor layer 310b disposed on the first semiconductor layer 310a.

The first semiconductor layer 310a may be a p-type semiconductor layer, and the second semiconductor layer 310b may be an intrinsic semiconductor layer. For example, each of the first semiconductor layer 310a and the second semiconductor layer 310b may include indium-gallium-arsenic-phosphide (InGaAsP).

The first semiconductor layer 310a may contact the second semiconductor layer 310b. The first semiconductor layer 310a may contact a third optical waveguide 230, and the second semiconductor layer 310b may contact an absorber 320.

The absorber 320 may be an intrinsic semiconductor layer and have a thickness T2 in a range from about 0.12 μm to about 0.2 μm. In an embodiment, the absorber 320 may be doped with a p-type impurity. The rest components may be the same as or similar to those described with reference to FIGS. 1 to 4.

Figure 8:
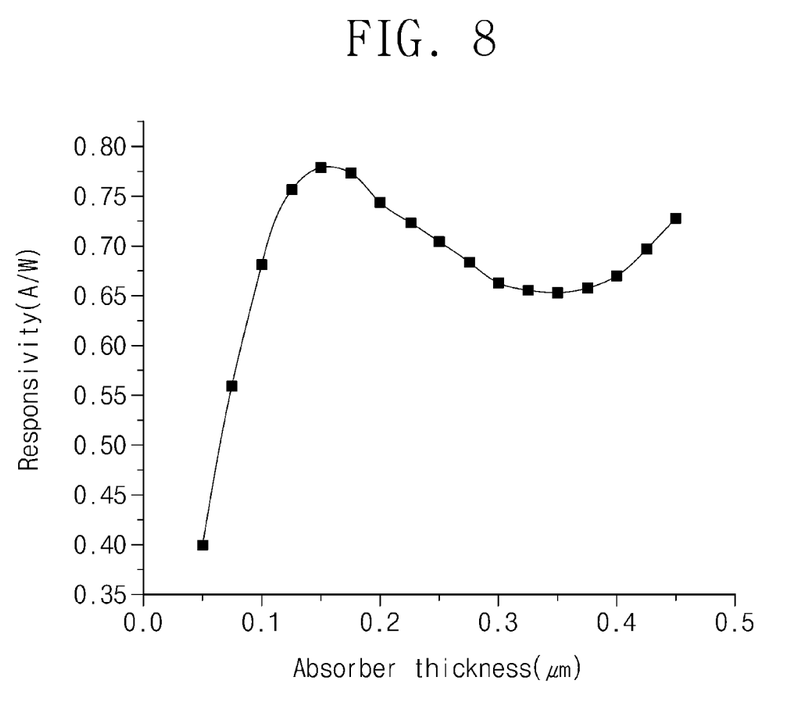
FIG. 8 is a graph representing a calculated responsivity of an absorber of the waveguide photodetector.

FIG. 8 is a graph representing a calculated responsivity of an absorber of the waveguide photodetector. Specifically, in this calculation, the waveguide photodetector 1000 described with reference to FIGS. 1 to 4 is used.

The semiconductor substrate 100 includes indium-phosphide (InP), and the first optical waveguide has a laminated structure in which indium-gallium-arsenic-phosphide (InGaAsP) having a thickness of about 0.1 μm and indium-phosphide (InP) having a thickness of about 1 μm are alternately repeated. The second optical waveguide 220 includes indium-gallium-arsenic-phosphide (InGaAsP) having a thickness of about 0.35 μm and indium-phosphide (InP) having a thickness of about 0.2 μm. The refractive index matching layer 310 include indium-gallium-arsenic-phosphide (InGaAsP) having a thickness of about 0.15 μm. The clad layer 330 include indium-phosphide (InP) having a thickness of about 0.3 μm. A responsivity of the waveguide photodetector is measured as an absorber thickness of the absorber 320 including the indium-gallium-arsenic-phosphide (InGaAsP) is varied.

Referring to FIG. 8, high responsivities are shown at the thickness in a range from about 0.12 μm to about 0.2 μm.

According to the embodiment of the inventive concept, the waveguide photodetector may perform the high speed operation and increase the light absorption rate by including the thin absorber and the refractive index matching layer including the intrinsic semiconductor layer. As the light mode is changed while passing through the first to third optical waveguides, light absorption efficiency may be good even if the absorber is thin.

Although the embodiments of the present invention have been described, it is understood that the present invention should not be limited to these embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A waveguide photodetector comprising:
a semiconductor substrate;
a first optical waveguide and a second optical waveguide, which are sequentially laminated on the semiconductor substrate, wherein each of the first optical waveguide and the second optical waveguide comprises a first portion and a second portion, and the first portion extends from the second portion in a first direction parallel to a top surface of the semiconductor substrate;
a refractive index matching layer disposed on the second portion of the second optical waveguide;
a clad layer disposed on the refractive index matching layer; and
an absorber disposed between the refractive index matching layer and the clad layer,
wherein:
the second optical waveguide has a first conductive-type, and the clad layer has a second conductive-type opposite to the first conductive-type,
the refractive index matching layer comprises a first semiconductor layer that is an intrinsic semiconductor layer,
the refractive index matching layer and the absorber comprise semiconductor materials different from each other, and
the absorber has a thickness in a range from about 0.12 μm to about 0.2 μm.

2. The waveguide photodetector of claim 1, wherein the absorber is an intrinsic semiconductor layer.

3. The waveguide photodetector of claim 1, wherein the first portion of the second optical waveguide is tapered.

4. The waveguide photodetector of claim 1, wherein the refractive index matching layer contacts the absorber and the second optical waveguide.

5. The waveguide photodetector of claim 1, wherein the refractive index matching layer has a refractive index less than that of the absorber and greater than that of the second optical waveguide.

6. The waveguide photodetector of claim 1, further comprising a first conductive-type third optical waveguide disposed between the refractive index matching layer and the second optical waveguide,
wherein the third optical waveguide comprises a first portion and a second portion, and the first portion of the third optical waveguide protrudes from the second portion of the third optical waveguide and extends in the first direction parallel to the top surface of the semiconductor substrate,
the third optical waveguide comprises an intrinsic semiconductor layer or a first conductive-type semiconductor layer, and
the first portion of the third optical waveguide is tapered.

7. The waveguide photodetector of claim 6, wherein the second optical waveguide has a thickness less than that of the first optical waveguide, and
the third optical waveguide has a thickness less than that of the second optical waveguide.

8. The waveguide photodetector of claim 1, wherein the absorber is a semiconductor layer doped with a second conductive-type impurity.

9. The waveguide photodetector of claim 1, wherein the refractive index matching layer further comprises a second semiconductor layer doped with a first conductive-type impurity, and
the second semiconductor layer is disposed between the first semiconductor layer and the second optical waveguide.

10. The waveguide photodetector of claim 1, wherein the refractive index matching layer comprises indium-gallium-arsenic-phosphide (InGaAsP), and
the absorber comprises indium-gallium-arsenide (InGaAs).

11. The waveguide photodetector of claim 1, further comprising:
- a first electrode disposed on the second portion of the second optical waveguide and spaced apart from the refractive index matching layer; and
- a second electrode disposed on the clad layer.

* * * * *